(12) United States Patent
Melichar et al.

(10) Patent No.: US 7,782,061 B2
(45) Date of Patent: Aug. 24, 2010

(54) BATTERY OHMIC RESISTANCE CALCULATION SYSTEM AND METHOD

(75) Inventors: Robert J. Melichar, Troy, MI (US); Hans I Johnson, Washington, MI (US)

(73) Assignee: Cobasys, LLC, Orion, MI (US)

( * ) Notice: Subject to any disclaimer, the term of this patent is extended or adjusted under 35 U.S.C. 154(b) by 817 days.

(21) Appl. No.: 11/725,240

(22) Filed: Mar. 16, 2007

(65) Prior Publication Data
US 2008/0224718 A1 Sep. 18, 2008

(51) Int. Cl.
*G01N 27/416* (2006.01)
(52) U.S. Cl. ........................ 324/430; 324/432
(58) Field of Classification Search ............... 324/430, 324/434, 426, 432; 320/132
See application file for complete search history.

(56) References Cited

U.S. PATENT DOCUMENTS

| | | | |
|---|---|---|---|
| 6,556,020 B1* | 4/2003 | McCabe et al. | 324/426 |
| 2004/0239333 A1* | 12/2004 | Kikuchi | 324/434 |
| 2005/0269991 A1* | 12/2005 | Mitsui et al. | 320/132 |
| 2007/0090798 A1* | 4/2007 | Yun et al. | 320/116 |

* cited by examiner

*Primary Examiner*—Edward Tso
*Assistant Examiner*—Richard V Muralidar

(57) ABSTRACT

An apparatus that estimates the ohmic resistances of N batteries includes voltage and current measurement modules that respectively measure the voltage and current of each of the N batteries. An ohmic resistance estimating module over N+1 time periods receives the voltage and current measurements of each of the N batteries and receives consecutive voltage and current measurements for one of the N batteries. N is a positive integer and the ohmic resistance estimating module estimates the ohmic resistance of the battery that is associated with the consecutive voltage and current measurements.

21 Claims, 4 Drawing Sheets

BATTERY OHMIC RESISTANCE CALCULATION SYSTEM AND METHOD

FIELD OF THE INVENTION

The present invention relates to battery systems, and more particularly to estimating ohmic resistances of batteries.

BACKGROUND OF THE INVENTION

Battery systems may be used to provide power in a wide variety of applications. Exemplary transportation applications include hybrid electric vehicles (HEV), electric vehicles (EV), heavy duty vehicles (HDV) and vehicles with 42-volt electrical systems. Exemplary stationary applications include backup power for telecommunications systems, uninterruptible power supplies (UPS), and distributed power generation applications.

Examples of the types of batteries that are used include nickel metal hydride (NiMH) batteries, lead-acid batteries, and other types of batteries. A battery system may include a plurality of battery subpacks that are connected in series and/or in parallel. The battery subpacks may include a plurality of batteries that are connected in parallel and/or in series.

Inherent properties of a battery include an ohmic resistance $R_o$. The ohmic resistance $R_o$ can be modeled as a resistance in series with the battery and estimated based on battery voltage and current measurements. The estimated ohmic resistance $R_o$ can be used to estimate other battery parameters such as state of charge, maximum power, and so forth. There remains a need for methods of estimating the ohmic resistance $R_o$ in situ.

SUMMARY OF THE INVENTION

An apparatus that estimates the ohmic resistances of N batteries includes voltage and current measurement modules that respectively measure the voltage and current of each of the N batteries. An ohmic resistance estimating module over N+1 time periods receives the voltage and current measurements of each of the N batteries and receives consecutive voltage and current measurements for one of the N batteries. N is a positive integer and the ohmic resistance estimating module estimates the ohmic resistance of the battery that is associated with the consecutive voltage and current measurements.

In other features the consecutive voltage and current measurements are associated with a different one of the N batteries every N+1 periods. The ohmic resistance estimating module estimates a difference between the consecutive current measurements. The ohmic resistance estimating module estimates an absolute value of the difference between the consecutive current measurements. The ohmic resistance estimating module compares the absolute value to a predetermined current limit. The ohmic resistance estimating module selectively estimates the ohmic resistance based on the comparison.

In other features the ohmic resistance estimating module estimates the ohmic resistance based on $$R_o = R_{o_{last}} + \left(\frac{V - Vl}{I - Il} - R_{o_{last}}\right) * \tau$$

where $R_o$ is the estimated ohmic resistance of the battery associated with the consecutive voltage and current measurements, $R_{o_{last}}$ is a previous value of $R_o$, V and Vl are the consecutive voltage measurements, I and Il are the consecutive current measurements and $\tau$ is a filter constant.

A method of estimating the ohmic resistances of N batteries includes periodically measuring the voltage and current of each of the N batteries and over N+1 periods measuring the voltage and current of each battery and consecutively measuring the voltage and current of one of the N batteries. The method also includes estimating the ohmic resistance of the battery associated with the consecutive measurements. The estimation is based on the consecutive measurements. N is a positive integer.

In other features the consecutive voltage and current measurements are associated with a different one of the N batteries for every N+1 periods. The method also includes estimating a difference between the consecutive current measurements, estimating an absolute value of the difference between the consecutive current measurements, comparing the absolute value to a predetermined current limit, and selectively estimating the ohmic resistance based on the comparison.

In other features the ohmic resistance is based on $$R_o = R_{o_{last}} + \left(\frac{V - Vl}{I - Il} - R_{o_{last}}\right) * \tau.$$

An apparatus that estimates the ohmic resistances of N batteries includes voltage and current measurement means for respectively measuring the voltage and current of each of the N batteries. Ohmic resistance estimating means periodically receive the voltage and current measurements associated with the N batteries and over N+1 periods receive the measurements associated with each of the N batteries and receive consecutive voltage and current measurements for one of the N batteries. N is a positive integer. The ohmic resistance estimating means estimates the ohmic resistance of the battery that is associated with the consecutive voltage and current measurements.

In other features the consecutive voltage and current measurements are associated with a different one of the N batteries for each N+1 period. The ohmic resistance estimating means estimates a difference between the consecutive current measurements. The ohmic resistance estimating means estimates an absolute value of the difference between the consecutive current measurements. The ohmic resistance estimating means compares the absolute value to a predetermined current limit. The ohmic resistance estimating means selectively estimates the ohmic resistance based on the comparison.

In other features the ohmic resistance estimating means estimates the ohmic resistance based on $$R_o = R_{o_{last}} + \left(\frac{V - Vl}{I - Il} - R_{o_{last}}\right) * \tau.$$

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
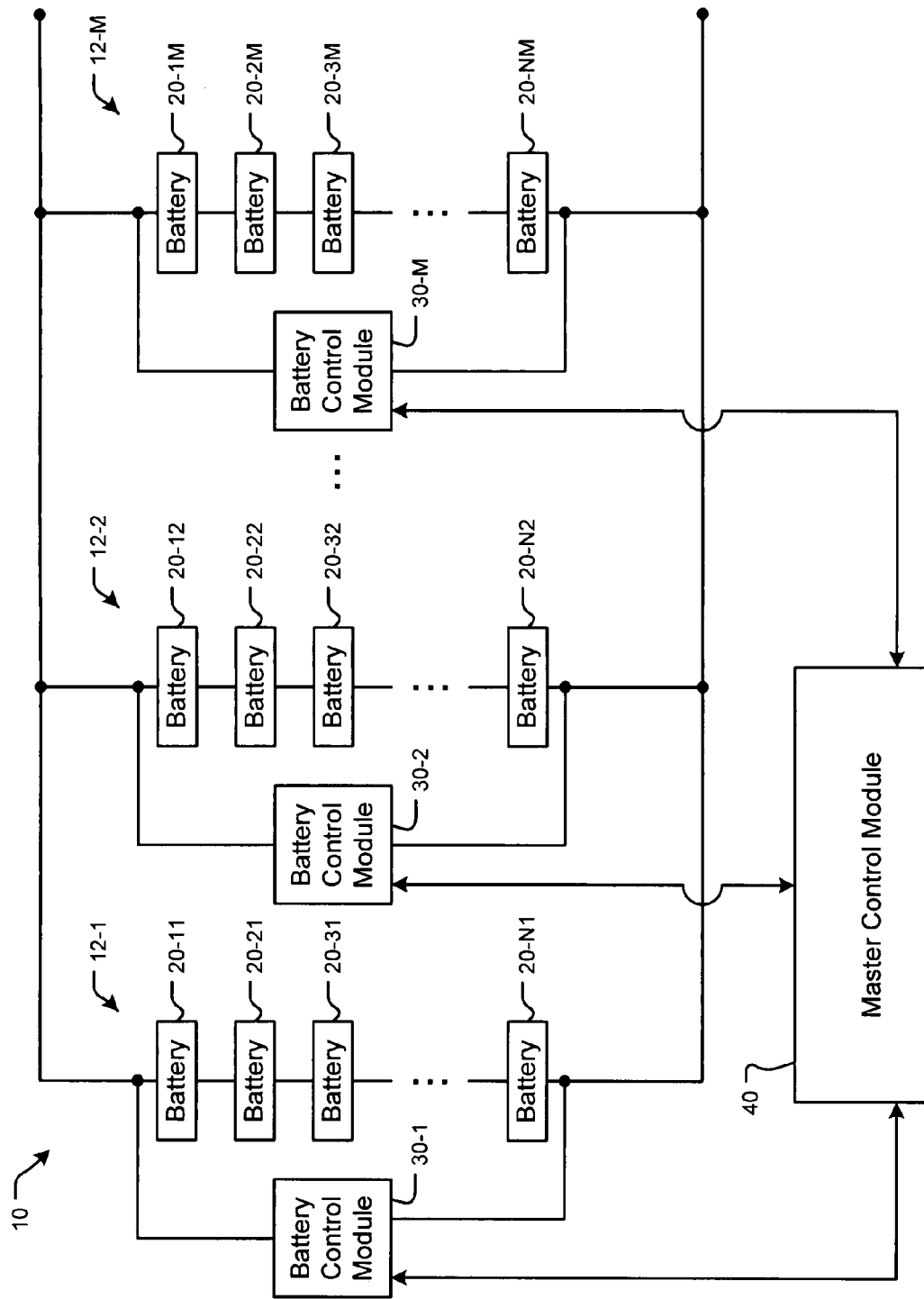
FIG. 1 is a functional block diagram of a battery system including battery subpacks, battery control modules and a master control module.

The following description of the preferred embodiment(s) is merely exemplary in nature and is in no way intended to limit the invention, its application, or uses. For purposes of clarity, the same reference numbers will be used in the drawings to identify the same elements. As used herein, the term module or device refers to an application specific integrated circuit (ASIC), an electronic circuit, a processor (shared, dedicated, or group) and memory that execute one or more software or firmware programs, a combinational logic circuit, and/or other suitable components that provide the described functionality.

An exemplary system that can be used to estimate the ohmic resistance $R_o$ of a battery will be shown, although skilled artisans will appreciate that other systems may be used. Referring now to FIG. 1, an exemplary embodiment of a battery system 10 is shown to include M battery subpacks 12-1, 12-2, ..., and 12-M (collectively battery subpacks 12). Battery subpacks 12-1, 12-2, ..., and 12-M include N series connected batteries 20-11, 20-12, ..., and 20-NM (collectively batteries 20). Battery control modules 30-1, 30-2, ... and 30-M (collectively battery control modules 30) are associated with each of battery subpacks 12-1, 12-2, ... and 12-M, respectively. In some embodiments, M is equal to 2 or 3, although additional or fewer subpacks may be used. In some embodiments, N is equal to 12-24, although additional and/or fewer batteries 20 may be used.

Battery control modules 30 sense voltage and current of battery subpacks 12. Alternatively, battery control modules 30 may monitor one or more individual batteries 20 in battery subpacks 12 and perform appropriate scaling and/or adjustment. Battery control modules 30 communicate with a master control module 40 using wireless and/or wired connections. In some embodiments battery control modules 30 and master control module 40 can be consolidated into a single module.

Figure 2:
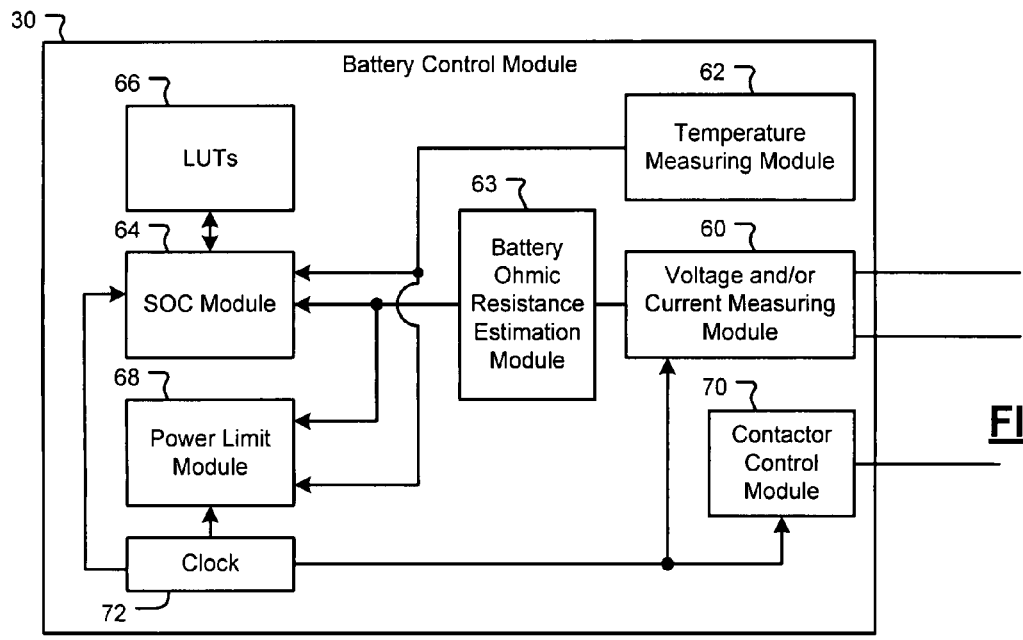
FIG. 2 is a functional block diagram of a battery control module.

Referring now to FIG. 2, an exemplary battery control module 30 is shown. Each battery control module 30 includes a voltage and current measuring module 60 that measures voltage and currents of N associated batteries 20. A battery ohmic resistance estimation module 63 receives the voltage and current measurements from voltage and current measuring module 60. Estimation module 63 estimates the ohmic resistances $R_o$ for each of the N batteries 20. The ohmic resistances $R_o$ are based on the voltage and current measurements.

A battery temperature sensing module 62 measures temperature at at least one location within an associated battery subpack 12. A battery state of charge (SOC) module 64 periodically determines the SOC of batteries 20 in the associated battery subpack 12. SOC module 64 may employ the $R_o$ estimations from estimation module 63, a lookup table 66, formulas and/or other methods to determine the SOC.

A power limit module 68 can predicts a maximum current limit $I_{LIM}$, battery voltage limit $V_{LIM}$, and/or power limit $P_{LIM}$ for the associated battery subpack 12 and/or one or more of its batteries 20. A contactor control module 70 controls one or more contactors (not shown) that are associated with the control and/or connection of batteries 20 in battery subpacks 12. A clock circuit 72 generates one or more clock signals for one or more of the modules within battery control module 30.

Figure 3:
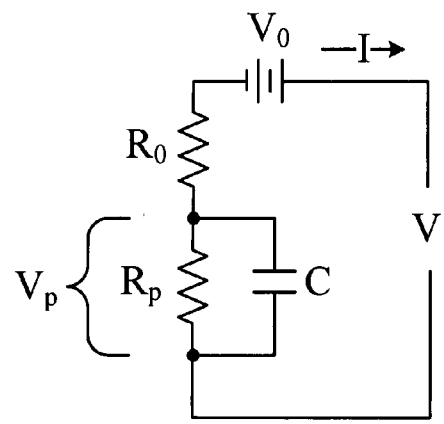
FIG. 3 is an equivalent circuit of a battery.

Referring now to FIG. 3, an equivalent circuit for battery 20 is shown. A resistor $R_o$ represents the ohmic resistance, a voltage $V_P$ represents a polarization voltage, a voltage $V_O$ represents an open circuit or relaxation voltage, a current I represents current and a voltage V represents the battery voltage. V and I are measured values. $R_p$ varies with temperature, current I and SOC. $V_O$ and $R_o$ vary primarily with SOC. When current I is steady state, $V_P$ is equal to measured current I times $R_p$. Using the equivalent circuit and Kirchoff's voltage rules for battery 20, $V=V_0+V_p+IR_o$.

Figure 4:
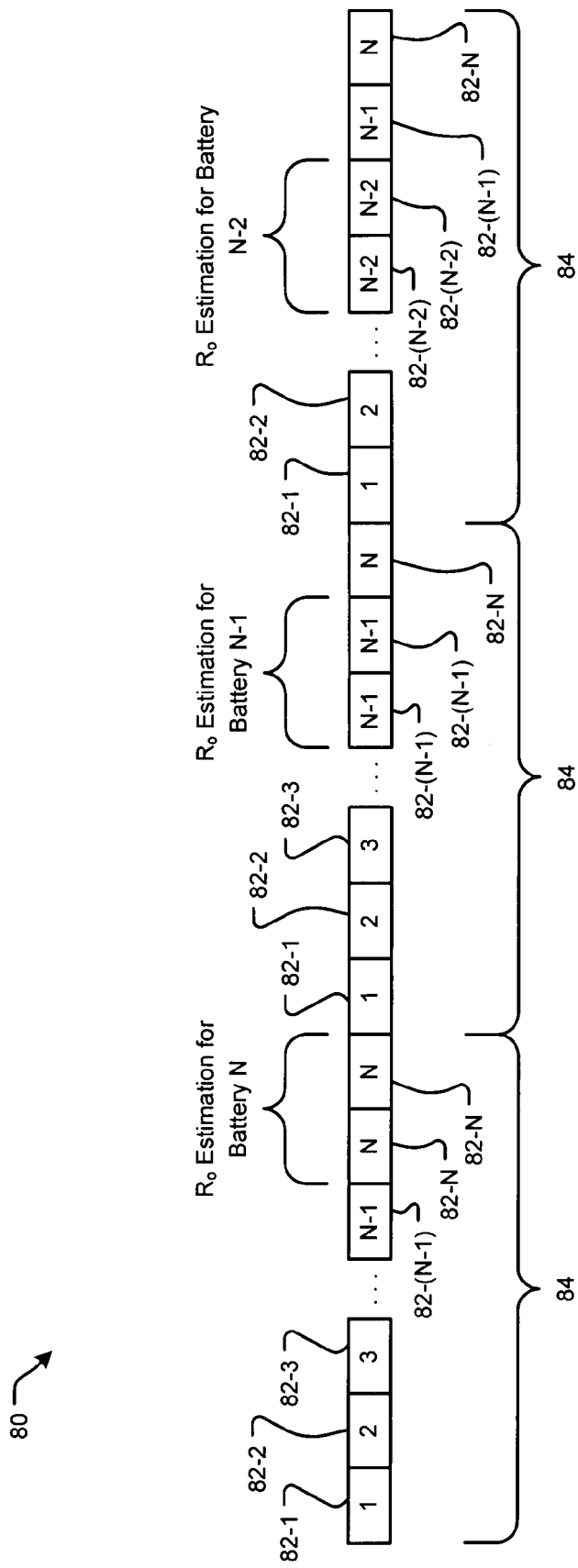
FIG. 4 is a timeline of battery voltage and current measurements and associated battery ohmic resistance ($R_o$) estimations.

Referring now to FIG. 4, a timeline 80 shows a sequence with which estimation module 63 receives voltage and current measurements 82. Timeline 80 is divided into a plurality of measurement sets 84. During each measurement set 84, estimation module 63 receives the voltage and current measurements 82 of each battery 20. During each measurement set 84 estimation module 63 also receives two consecutive voltage and current measurements 82 that are associated with one of the batteries 20. The battery 20 that is associated with the two consecutive voltage and current measurements 82 changes for each measurement set 84 until estimation module 63 has received the two consecutive voltage and current measurements 82 for all N batteries 20 of a battery subpack 12. The pattern of measurement sets 84 then repeats.

Figure 5:
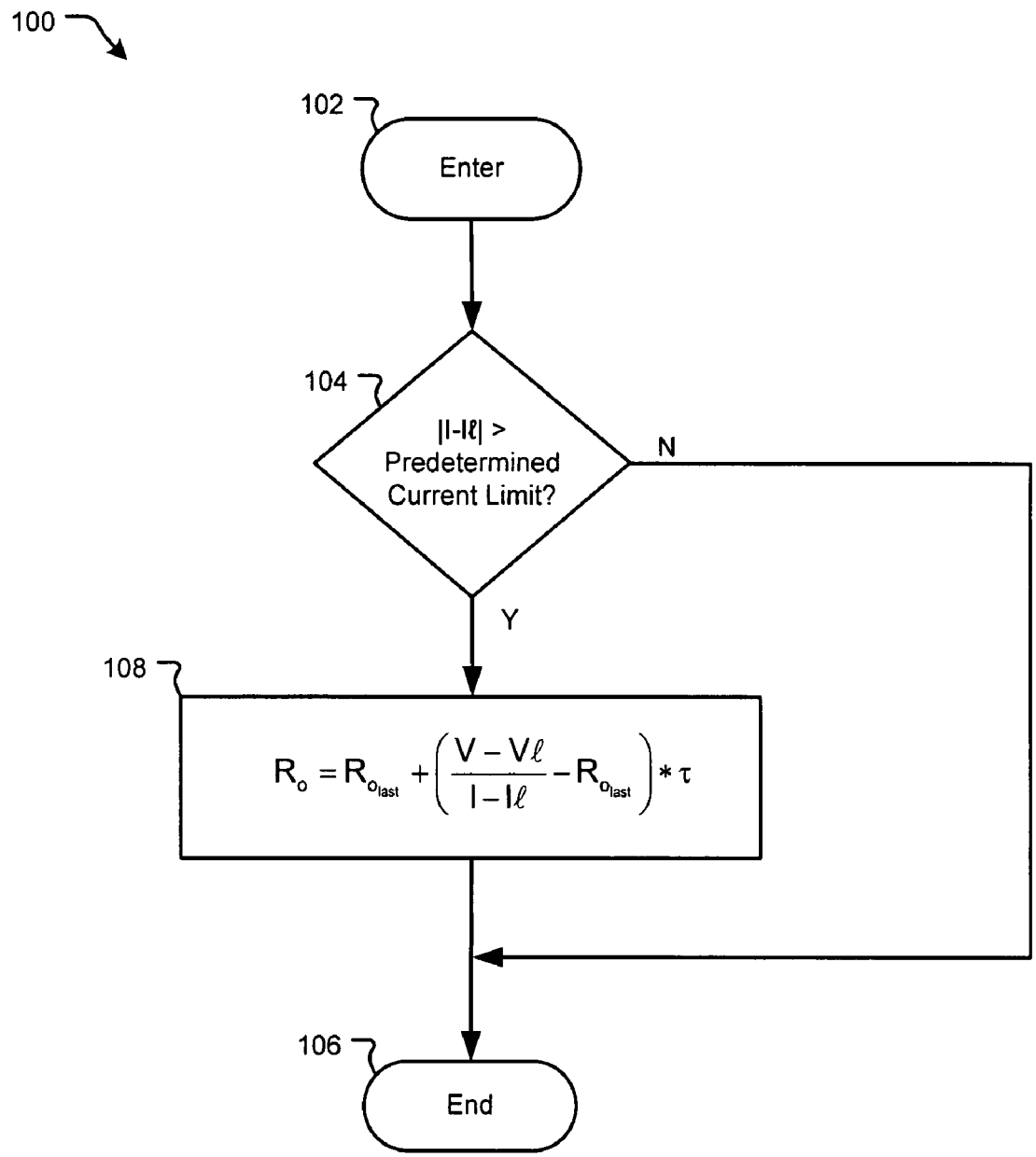
FIG. 5 is a flowchart of a method for determining whether to estimate battery ohmic resistance $R_o$.

Referring now to FIG. 5, a flowchart 100 is shown for a method of estimating the ohmic resistance of each battery 20. Method 100 can be executed by estimation module 63 upon receiving the second voltage and current reading in each pair of consecutive voltage and current measurements 82 that are shown in FIG. 4.

Control enters through block 102 and immediately proceeds to decision block 104. In decision block 104 control estimates the magnitude of the difference between the first current (I) and the second current (Il) measurements in the pair of consecutive voltage and current measurements 82. Control then compares the magnitude of current change between the two consecutive current measurements to a predetermined current limit. If the magnitude of the current change is less than or equal to the predetermined current limit then control branches from decision block 104 to an exit block 106. On the other hand, if the magnitude of the current change is greater than the predetermined current limit then control branches from decision block 104 to block 108.

In block 108 control estimates the ohmic resistance of battery sub-pack 12 that is associated with the present pair of consecutive measurements 82. The ohmic resistance can be based on the equation $$R_o = R_{o_{last}} + \left(\frac{V - Vl}{I - Il} - R_{o_{last}}\right) * \tau$$

where $R_o$ is the present value of ohmic resistance, $R_{o_{last}}$ is the ohmic resistance from the previous execution of method 100 for the present battery 20, Vl is the battery voltage from the previous execution of method 100 for the present battery 20, and τ is a filtering time constant. In some embodiments τ is equal to about 0.01.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An apparatus that estimates the ohmic resistances of N batteries, comprising:
    voltage and current measurement modules that respectively measure the voltage and current of each of the N batteries; and
    an ohmic resistance estimating module that over N+1 time periods receives the voltage and current measurements of each of the N batteries and that receives consecutive voltage and current measurements for one of the N batteries, wherein N is a positive integer and wherein the ohmic resistance estimating module estimates an ohmic resistance of the battery that is associated with the consecutive voltage and current measurements, wherein the ohmic resistance is at least partially based on a difference between:
    a quotient of a first voltage measurement minus a consecutive second voltage measurement divided by a first current measurement minus a consecutive second current measurement, and
    a previous value of the ohmic resistance.

2. The apparatus of claim 1 wherein the consecutive voltage and current measurements are associated with a different one of the N batteries every N+1 periods.

3. The apparatus of claim 1 wherein the ohmic resistance estimating module estimates a difference between the first current measurement and the consecutive second current measurement.

4. The apparatus of claim 3 wherein the ohmic resistance estimating module estimates an absolute value of the difference between the first current measurement and the consecutive second current measurement.

5. The apparatus of claim 4 wherein the ohmic resistance estimating module compares the absolute value to a predetermined current limit.

6. The apparatus of claim 5 wherein the ohmic resistance estimating module selectively estimates the ohmic resistance based on the comparison.

7. The apparatus of claim 1 wherein the ohmic resistance estimating module estimates the ohmic resistance based on $$R_o = R_{o_{last}} + \left(\frac{V - Vl}{I - Il} - R_{o_{last}}\right) * \tau$$

where $R_o$ is the estimated ohmic resistance of the battery associated with the consecutive voltage and current measurements, $R_{o_{last}}$ is the previous value of $R_o$, V and Vl are the consecutive voltage measurements, I and Il are the consecutive current measurements and τ is a filter constant.

8. A method of estimating the ohmic resistances of N batteries, comprising:
    periodically measuring the voltage and current of each of the N batteries and over N+1 periods measuring the voltage and current of each battery and consecutively measuring the voltage and current of one of the N batteries; and
    estimating an ohmic resistance of the battery associated with the consecutive measurements wherein the estimation is based on the consecutive measurements and wherein N is a positive integer, wherein the ohmic resistance is at least partially based on a difference between:
    a quotient of a first voltage measurement minus a consecutive second voltage measurement divided by a first current measurement minus a consecutive second current measurement, and
    a previous value of the ohmic resistance.

9. The method of claim 8 wherein the consecutive voltage and current measurements are associated with a different one of the N batteries every N+1 periods.

10. The method of claim 8 further comprising estimating a difference between the first current measurement and the consecutive second current measurement.

11. The method of claim 10 further comprising estimating an absolute value of the difference between the first current measurement and the consecutive second current measurement.

12. The method of claim 11 further comprising comparing the absolute value to a predetermined current limit.

13. The method of claim 12 further comprising selectively estimating the ohmic resistance based on the comparison.

14. The method of claim 8 wherein the ohmic resistance is based on $$R_o = R_{o_{last}} + \left(\frac{V - Vl}{I - Il} - R_{o_{last}}\right) * \tau$$

where $R_o$ is the estimated ohmic resistance of the battery associated with the consecutive voltage and current measurements, $R_{o_{last}}$ is the previous value of $R_o$, V and Vl are the consecutive voltage measurements, I and Il are the consecutive current measurements and τ is a filter constant.

15. An apparatus that estimates the ohmic resistances of N batteries, comprising:
    voltage and current measurement means for respectively measuring the voltage and current of each of the N batteries; and
    ohmic resistance estimating means for periodically receiving the voltage and current measurements associated with the N batteries and over N+1 periods receiving the measurements associated with each of the N batteries and receiving consecutive voltage and current measurements for one of the N batteries, wherein N is a positive integer and wherein the ohmic resistance estimating means estimates the ohmic resistance of the battery that is associated with the consecutive voltage and current measurements, wherein the ohmic resistance is at least partially based on a difference between:
    a quotient of a first voltage measurement minus a consecutive second voltage measurement divided by a first current measurement minus a consecutive second current measurement, and
    a previous value of the ohmic resistance.

16. The apparatus of claim 15 wherein the consecutive voltage and current measurements are associated with a different one of the N batteries every N+1 periods.

17. The apparatus of claim 15 wherein the ohmic resistance estimating means estimates a difference between the first current measurement and the consecutive second current measurement.

18. The apparatus of claim 17 wherein the ohmic resistance estimating means estimates an absolute value of the difference between the first current measurement and the consecutive second current measurement.

19. The apparatus of claim 18 wherein the ohmic resistance estimating means compares the absolute value to a predetermined current limit.

20. The apparatus of claim 19 wherein the ohmic resistance estimating means selectively estimates the ohmic resistance based on the comparison.

21. The apparatus of claim 15 wherein the ohmic resistance estimating means estimates the ohmic resistance based on $$R_o = R_{o_{last}} + \left(\frac{V - Vl}{I - Il} - R_{o_{last}}\right) * \tau$$

where $R_o$ is the estimated ohmic resistance of the battery associated with the consecutive voltage and current measurements, $R_{o_{last}}$ is the previous value of $R_o$, V and Vl are the consecutive voltage measurements, I and Il are the consecutive current measurements and $\tau$ is a filter constant.

* * * * *